United States Patent
Caparro et al.

(10) Patent No.: US 7,222,737 B2
(45) Date of Patent: May 29, 2007

(54) DIE SORTER WITH REDUCED MEAN TIME TO CONVERT

(75) Inventors: Donald T. Caparro, New Hope, PA (US); Luis Alfonso Gordon, Huntingdon Valley, PA (US)

(73) Assignee: Orthodyne Electronics Corporation, Irvine, CA (US)

( * ) Notice: Subject to any disclaimer, the term of this patent is extended or adjusted under 35 U.S.C. 154(b) by 325 days.

(21) Appl. No.: 10/614,573

(22) Filed: Jul. 3, 2003

(65) Prior Publication Data

US 2005/0000866 A1  Jan. 6, 2005

(51) Int. Cl.
*B65D 85/00* (2006.01)

(52) U.S. Cl. .................. 206/710; 438/106; 438/464

(58) Field of Classification Search ................ 209/571, 209/572, 573, 574; 414/935; 438/106, 460, 438/464; 257/678, 685, 686–688; 206/710–712
See application file for complete search history.

(56) References Cited

U.S. PATENT DOCUMENTS

| | | | | | |
|---|---|---|---|---|---|
| 3,695,414 | A | * | 10/1972 | Wiesler et al. | 242/528 |
| 4,627,151 | A | * | 12/1986 | Mulholland et al. | 438/111 |
| 4,907,701 | A | * | 3/1990 | Kobayashi et al. | 209/576 |
| 5,484,062 | A | * | 1/1996 | Rich | 209/587 |
| 5,519,332 | A | * | 5/1996 | Wood et al. | 324/755 |
| 5,524,765 | A | * | 6/1996 | Gutentag | 206/713 |
| 5,654,204 | A | * | 8/1997 | Anderson | 438/15 |
| 5,743,695 | A | * | 4/1998 | Ryu | 414/331.01 |
| 5,747,139 | A | * | 5/1998 | Schenz | 428/120 |
| 5,878,485 | A | * | 3/1999 | Wood et al. | 29/825 |
| 5,913,104 | A | * | 6/1999 | Piper et al. | 438/14 |
| 6,091,498 | A | * | 7/2000 | Hanson et al. | 356/623 |
| 6,175,161 | B1 | * | 1/2001 | Goetz et al. | 257/780 |
| 6,365,860 | B1 | * | 4/2002 | Beffa | 209/573 |
| 6,818,543 | B2 | * | 11/2004 | Bendat et al. | 438/613 |
| 6,861,608 | B2 | * | 3/2005 | Koduri et al. | 209/573 |
| 6,897,096 | B2 | * | 5/2005 | Cobbley et al. | 438/123 |
| 6,900,459 | B2 | * | 5/2005 | Farnworth et al. | 257/48 |
| 6,984,533 | B1 | * | 1/2006 | Regos et al. | 438/15 |
| 2002/0182759 | A1 | * | 12/2002 | Yamagata et al. | 438/11 |
| 2003/0188997 | A1 | * | 10/2003 | Tan et al. | 209/538 |
| 2005/0077205 | A1 | * | 4/2005 | Pylant et al. | 206/710 |
| 2005/0077206 | A1 | * | 4/2005 | Pylant et al. | 206/710 |
| 2005/0126954 | A1 | * | 6/2005 | Redding | 206/710 |
| 2005/0194668 | A1 | * | 9/2005 | Enquist et al. | 257/678 |
| 2006/0006095 | A1 | * | 1/2006 | White, Jr. | 206/711 |

* cited by examiner

*Primary Examiner*—Patrick Mackey
(74) *Attorney, Agent, or Firm*—MacPherson Kwok Chen & Heid LLP; Tom Chen

(57) ABSTRACT

An adapter frame has channels that hold multiple die carriers in each channel. The die carriers, such as 2"×2" or 4"×4" waffle packs or GEL-PAK die carriers, slide into the channels and are secured by a spring clip retention mechanism. In other embodiments, the adapter frame has molded individual cavities to hold single die carriers. The adapter frame has the same exterior dimensions as a conventional wafer frame. This allows the adapter frame to be handled at the die sorter output in the same or similar manner as output wafer frames, thereby eliminating the need to change handlers when switching the output from a wafer frame to a specific die carrier.

19 Claims, 5 Drawing Sheets

DIE SORTER WITH REDUCED MEAN TIME TO CONVERT

BACKGROUND

1. Field of the Invention

The present invention relates to semiconductor manufacturing, and in particular, to semiconductor die sorting.

2. Related Art

One of the steps used during manufacturing of semiconductor dice is sorting die from a wafer or other platform. During a typical manufacturing process, the dice are first fabricated onto a semiconductor wafer, which is typically comprised primarily of silicon, although other materials such as gallium arsenide and indium phosphide are also sometimes used. Each semiconductor wafer has a plurality of integrated circuit semiconductor dice and/or circuitry, arranged in rows and columns with the periphery of each integrated circuit being substantially rectangular in shape, the integrated circuits of the semiconductor die being formed through a combination of deposition, etching, and photo-lithographic techniques. The inactive silicon backsides of the wafers are typically thinned (i.e., have their cross sections reduced) by a mechanical and/or chemical grinding process, and the wafers sawed into substantially rectangular-shaped discrete integrated circuit semiconductor dice.

During the fabrication and/or sawing process, individual dice may be damaged or defective. To prevent shipment or usage of defective dice, each of the dice is tested or probed to determine the level of functionality of the die. The die sorting, which can be in-situ with the testing, sorts the die identified from the testing step. For example, testing may identify a die as "good" or "bad", depending on the level of performance required by the die. Identification typically involves marking bad dies with a probe, ink mark, or other identifier. The dice are then sorted accordingly, such as placement into appropriate carriers so that the same types of dice, functionally, are grouped together. Depending on the type of output desired, different carriers can be used to hold the sorted die, depending on the requirements of the end customer. Some current output carriers include waffle packs, GEL-PAK die carriers, tape or adhesive mounted frames, and JEDEC trays.

The die sorting is usually performed with an equipment called a die sorter. The die sorter typically receives a wafer containing the dice to be sorted. Individual die are then selected from the wafer and placed into an output carrier. However, because the output carriers are different (e.g., different sizes, die trays, and/or handling procedures), the die sorter needs to be flexible to accommodate the different output carriers. Thus, die sorters should be able to be changed (e.g., mechanically and/or to software) each time a different output carrier is used to adjust for those differences. For example, the die sorter may first sort the dice onto a tape. If the die sorter is to next sort the dice onto a waffle pack, a different handler for the output carrier will be needed, as well as possible changes to the software and handling procedure. This need to change the die sorter results in added time and costs, as well as lower throughput due to increased downtime, for the overall die sorting processes.

Accordingly, there is a need for an improved die sorter that overcomes the deficiencies in the prior art as discussed above.

SUMMARY

According to one aspect of the present invention, a die sorter uses an adapter frame that is handled in the same or similar way as an output wafer frame. The adapter frame, in one embodiment, has the same physical exterior dimensions as a SEMI (Semiconductor Equipment and Materials International) standard film frame design for 8-inch and 12-inch wafers. The interior portion of the adapter frame has recesses or cavities that hold one or more die carriers, such as waffle packs or die carriers from GEL-PAK of Hayward, Calif. The type of cavities depends on the type of output carrier desired. Since the die sorter does not need to be adjusted or modified when handling the adapter frame, e.g., the adapter frame is capable of being loaded and unloaded from existing wafer frame cassettes in the same fashion as an output wafer frame, the die sorter is able to accommodate different types of output carriers without the need for special handlers.

According to one embodiment, the adapter frame is designed to hold waffle packs or GEL-PAK die carriers. The adapter frame has a generally circular exterior circumference and an interior portion with a plurality of rectangular cavities. The outer cavities are shorter and thus hold less die carriers than the inner cavities. In one embodiment, an 8-inch adapter frame with four rectangular cavities holds twelve 2"×2" waffle packs or GEL-PAK die carriers or an 8-inch adapter frame with one rectangular cavity holds two 4"×4" waffle packs or GEL-PAK die carriers. In another embodiment, a 12-inch adapter frame with six rectangular cavities holds twenty four 2" by 2" or a 12-inch adapter frame with four square cavities holds four 4"×4" waffle packs or GEL-PAK carriers.

The die carriers, after being sorted from the input wafer, are placed into the cavities of the adapter frame. The cavities are designed such that the die carriers, once placed, remain relatively stationary during the die sorting process. Thus, in one embodiment, the width of the rectangular cavities is approximately the same as the width of the die carrier and the length of the cavities is an approximately integer multiple of the length of the die carrier. Further, in one embodiment, the depth of the cavities is more than the thickness of the die carriers, which allows die carrier covers to be placed onto the individual die carriers on the frame adapter without removing the die carrier from the adapter frame or the adapter frame from the die sorter.

Consequently, the present invention uses an adapter frame, handled the same way as a wafer (e.g., with the wafer table, wafer cassette, and cassette elevator), to load waffle packs or other output die carriers, thereby eliminating the need for a separate handler for the output die carriers. Compared to conventional die sorters, only one module, a wafer handler including the elevator for the wafer cassette, is required to handle wafers and waffle packs/GEL-PAK carriers as die carriers at the output of the die sorter, instead of two specific modules for wafers and waffle packs/GEL-PAK carriers.

By eliminating the need for a specific handling module, both time and costs are saved in the manufacture of semiconductor devices. The need for changeover from one output carrier type (e.g., wafer) to another (e.g., waffle pack or GEL-PAK carrier) and vice versa is virtually eliminated. This improves the time in production (e.g., no downtime for electromechanical conversions) and significantly reduces the cost and complexity of die sorting equipment.

This invention will be more fully understood in conjunction with the following detailed description taken together with the following drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

Figure 1:
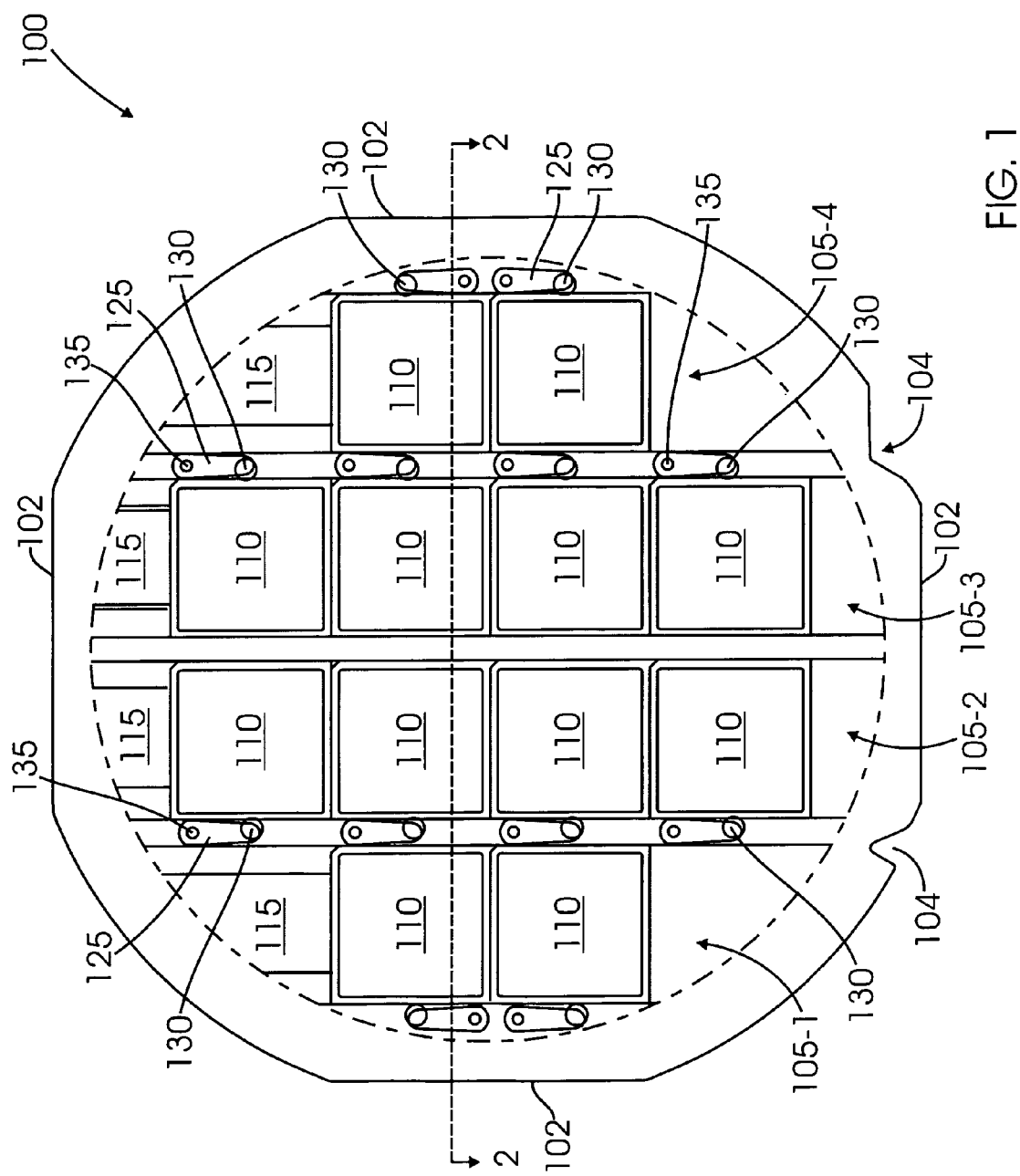
FIG. 1 shows a top view of an adapter frame having a plurality of cavities according to one embodiment of the invention.

FIG. 1 shows a top view of an adapter frame 100 according to one aspect of the present invention. Adapter frame 100 has a generally circular outer dimension, with exterior dimensions and shape similar to a SEMI standard film frame design. This allows a die sorter to handle adapter frame 100 in the same or similar manner to that of a conventional wafer frame. Note that "generally circular" and "circular" as used herein may include shapes that are completely circular or oval and/or have straight edges or angled-edges along the outer circumference that may facilitate frame handling by a die sorter. As seen in FIG. 1, the outer circumference of adapter frame 100 has straight edges 102 and notches 104. In one embodiment, adapter frame 100 is approximately 11.65 inches in diameter, with an inner diameter of approximately 9.8 inches. The length from opposing straight edges is approximately 10.866 inches. Adapter frame 100 of FIG. 1 corresponds to an equivalent SEMI standard frame for eight-inch wafers, e.g., same or similar exterior dimensions. In another embodiment, a similarly sized and shaped frame is made that corresponds to a twelve-inch wafer. Adapter frame 100, in one embodiment, is made from a single piece of metal, e.g., aluminum. Adapter frame 100 may also be constructed with injection molded materials.

Adapter frame 100 includes a plurality of generally rectangular channels, cavities, or recesses 105 along the upper surface of adapter frame 100. Note that cavities 105, in other embodiments, may be generally square to accommodate the individual square die carriers. However, square cavities would necessitate a more complex loading and unloading process, as well as increase the complexity of existing die sorters. The width of the rectangular cavities is approximately the same size or slightly wider than the width of output die carriers 110. Output die carriers 110 may be, without limitation, waffle packs, GEL-PAK die carriers, and tape mounted frames. However, other carriers, such as tape and reel media or JEDEC trays, require yet another dedicated handling system specific to the media. Thus, in one embodiment, the width of rectangular cavities 105 is slightly larger than two inches to accommodate two-inch waffle packs or GEL-PAK die carriers. For example, in one embodiment, where waffle packs are 1.95 inches ±0.01 inches square, as presently set by vendors, the width of rectangular cavities 105 is 2.01 to 2.015 inches. The width is such that the die carriers do not move significantly or shift during the die sorting process, but still allows easy loading and unloading of the die carriers. Furthermore, the width must not be so tight that it is difficult for the die carriers to be placed into (loaded) and removed from (unloaded) rectangular cavities 105.

The number of rectangular cavities 105 depends on the size of adapter frame 100. FIG. 1 shows an 8-inch adapter frame, according to one embodiment, having two inner cavities 105-2 and 105-3 and two outer cavities 105-1 and 105-4. Inner cavities 105-2 and 105-3 are longer than outer cavities 105-1 and 105-4, and therefore are able to hold more output die carriers. For the 8-inch adapter frame, outer cavities 105-1 and 105-4 can each hold two 2"×2" die carriers (e.g., waffle pack or GEL-PAK), while inner cavities can each hold four 2"×2" die carriers.

Rectangular cavities 105 have barriers 115 located at one end of the cavities, with the opposite end open. The length of the cavities is longer than an integer multiple of the length of a single output die carrier. For example, for the 8-inch adapter frame, outer cavities 105-1 and 105-4 would be longer than four inches (two times the length of the die carrier) and inner cavities 105-2 and 105-3 would be longer than eight inches (four times the length of the die carrier). This would prevent any output die carriers from protruding from the end of rectangular cavities 105.

During the die sorting process, die carriers 110 are slid along rectangular cavities 105 from the open end toward barriers 115. Barriers 115 provide a stop for die carriers 110. In one embodiment, barriers 115 are integrally formed on adapter frame 100 so that barriers 115 and adapter frame 100 are a unitary piece. In other embodiments, barriers 115 are separate structures secured to adapter frame 100.

Adapter frame 100 also includes spring clips 125 that bias die carriers 110 against one side of square cavities 105 to prevent side-to-side movement and retain the die carriers in the cavities. It will be appreciated that spring clips 125 may be any suitable retention mechanism that is capable of securing the die carriers within the cavities. In one embodiment, only one set of spring clips 125 is needed to secure the die carriers in the cavities. However, in other embodiments, additional spring clips or other retention mechanisms may be included, where the additional spring clips or retention mechanisms bias the die carriers against a side of the rectangular cavities adjacent to the side biased by spring clips 125 and/or adjacent die carriers.

In one embodiment, retention mechanisms are steel spring clips 125 each with a spring loaded ball bearing 130 and a pivot pin 135. Spring clips 125 are located between columns of rectangular cavities 105. There is a spring clip 125 for each possible die carrier 110. For the embodiment shown in FIG. 1, since outer cavities 105-1 and 105-4 potentially can hold two die carriers each, there are two spring clips 125 for each outer cavity. Similarly, since inner cavities 105-2 and 105-3 potentially hold four die carriers each, there are four spring clips 125 for each inner cavity. Spring clips 125 are spaced such that only one retention mechanism biases a die carrier in the rectangular cavities. As shown in FIG. 1, spring clips 125 are positioned such that ball bearings 130 are located approximately at the center of each loaded die carrier 110. Spring clips 125 can move about pivot pin 135 secured to adapter frame 100.

Figure 2:
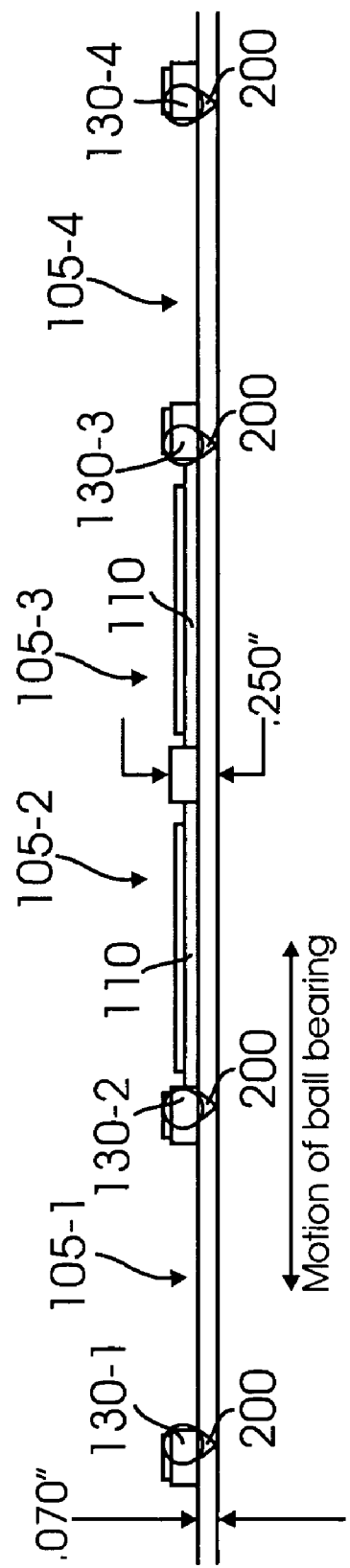
FIG. 2 shows a side view of a portion of the adapter frame of FIG. 1 along sectional line 2—2.

FIG. 2 shows a side view of a portion of adapter frame 100 of FIG. 1 along sectional line 2—2. When no force is applied to spring clip 125, e.g., there is no die carrier 110 pressed against the spring clip, ball bearing 130 remains in a V-shaped notch or groove 200 in adapter frame 100. This is shown with ball bearings 130-1 and 130-4 corresponding to outer cavities 105-1 and 105-4. Spring clips 125 are located between rectangular cavities 105 such that, in their natural position (i.e., no force applied), ball bearings 130 are partly inside rectangular cavities 105. In one embodiment, ball bearings 130 are less than half way inside the rectangular cavities. When a force is applied to spring clip 125, such as when a die carrier 110 is slid and placed into rectangular cavity 105, die carrier 110 forces ball bearing 130 up and out of V-shaped notch 200, as shown in rectangular inner cavities 105-2 and 105-3. The spring force presses ball bearing 130 against the side of die carrier 110 to force die carrier 110 against the side of rectangular cavity 105. In this manner, die carrier 110 is secured to adapter frame 100. The spring force is sufficient to maintain the die carriers in the rectangular cavities and prevent them from sliding out of the open end of the cavities. When die carriers 110 are unloaded from adapter frame 100, the spring force moves ball bearing 130 back into V-shaped notch 200. The arrow in FIG. 2 shows the direction of motion of ball bearing 130.

The depth of cavities 105 is such that the portion of die carrier 110 contacting ball bearing 130 is higher than the ball bearing centerline. This prevents ball bearing 130 from hanging over the die carrier, thereby allowing unobstructed placement of a waffle or die carrier cover without removing the die carrier from the adapter frame or the adapter frame from the die sorter machine. In one embodiment, the depth is approximately 0.18 inches for waffle packs having an overall thickness of approximately 0.15 inches.

Adapter frame 100 is designed to fit existing industry standard wafer film cassettes. Thus, there is no need to inventory die carrier mass storage containers or equipment specific process transfer containers. Further, since adapter frame 100 is handled in the same manner as a wafer, conventional die sorting and die attaching equipment utilizes the same automation procedures for handling adapter frame 100. Adapter frames are loaded and unloaded from conventional wafer frame cassettes, and consequently, no special equipment is needed.

Figure 3:
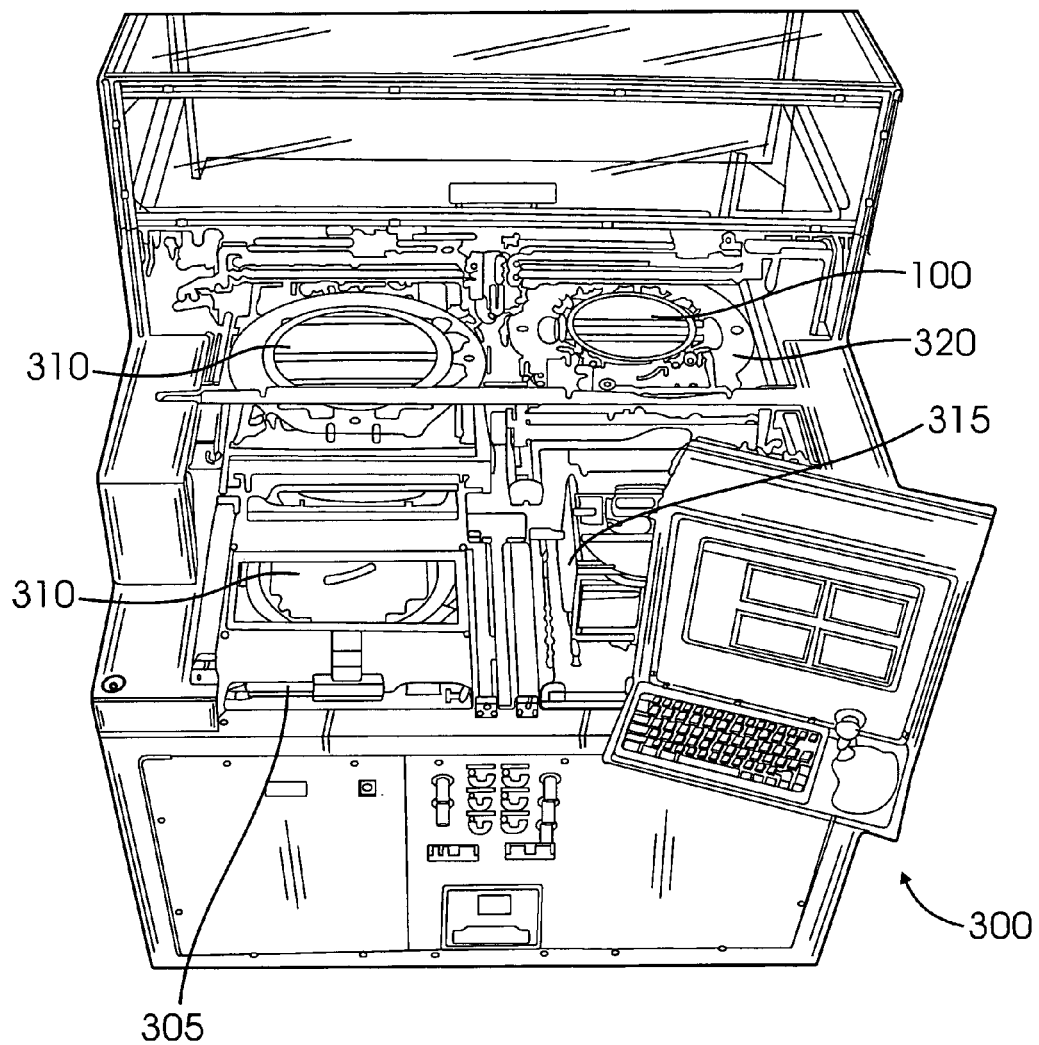
FIG. 3 shows a photo of a die sorter using an adapter frame of the present invention.
Figure 4:
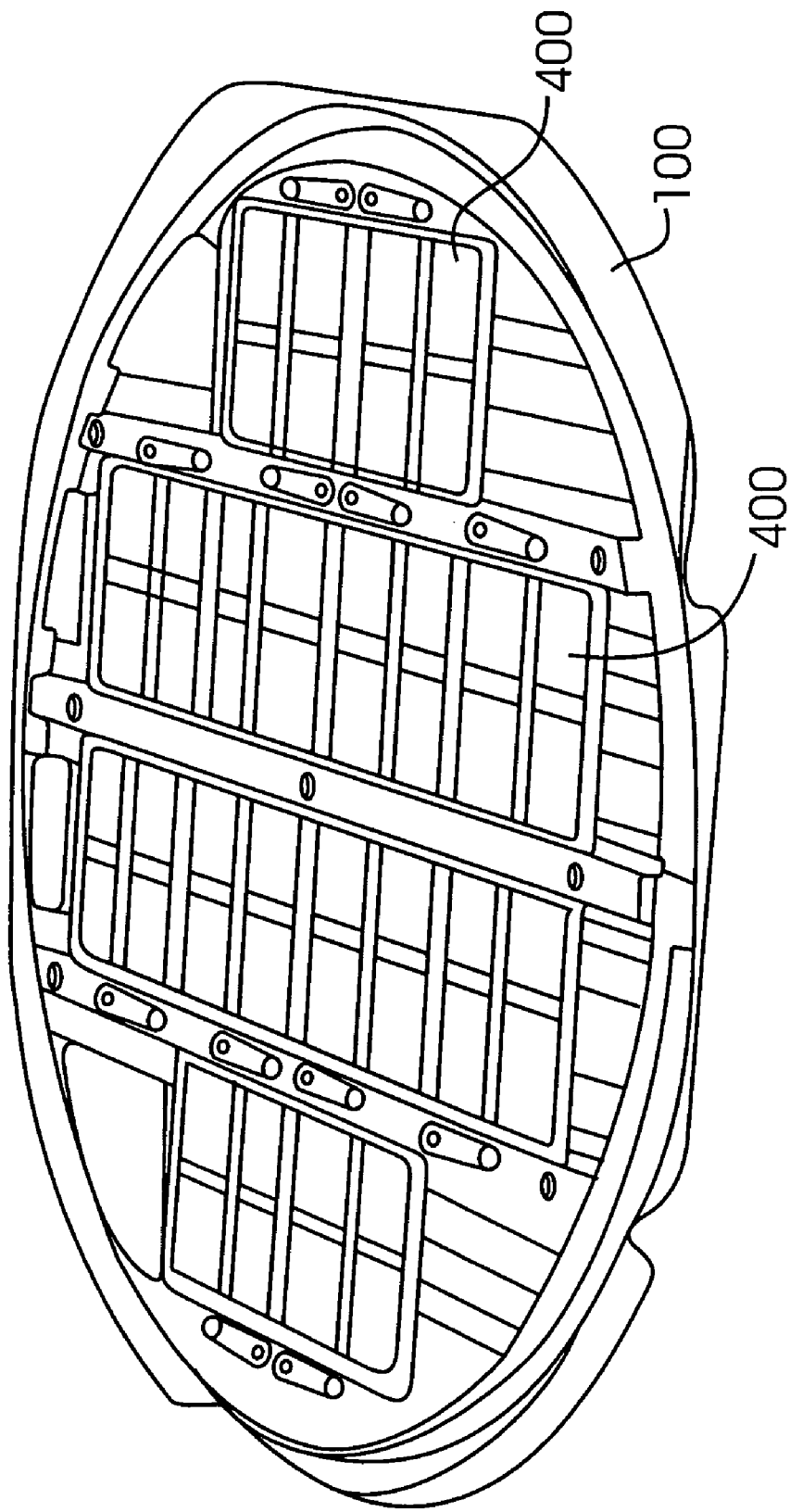
FIG. 4 shows a photo of an adapter frame loaded with waffle packs.

FIG. 3 shows a photo of a die sorter 300 that uses adapter frame 100 according to one embodiment. Die sorter 300 is a conventional die sorter or pick and place machine, such as the ESC Solutions 3000 XPT, Laurier DS6000, and Dymatix 1043. An input wafer cassette 305 containing a plurality of input wafer film frames 310 is loaded into die sorter 300. Conventional mechanisms, such as input frame handlers with load/unload elevators, select and unload individual wafer frames 310 from input wafer cassette 305 for sorting the dice on the wafer frame. At the output side of die sorter 300, an output wafer cassette 315 is loaded into the machine. Output wafer cassette 315 holds a plurality of adapter frames 100 of the present invention in the same fashion as output wafers. Conventional mechanisms, such as output frame cassette handlers with load/unload elevators, unload empty adapter frames 100 from output wafer cassette 315 to a platform 320. Dice from input wafer frame 310, such as in the form of waffle packs, can then be sorted onto adapter frame 100, such as with conventional die sorting mechanisms that identify "good" and "bad" die. FIG. 4 shows a photo of adapter frame 100 fully loaded with twelve 2"×2" waffle packs 400 (two in the outer cavities and four in the inner cavities), which can then be loaded back into output wafer cassette 315 (FIG. 3).

As used herein, die sorting is a method, process, or the like of testing semiconductor integrated circuits either packaged or un-packaged in die form, typically a semiconductor integrated circuit which has been separated from the wafer. The die sort process generally tests each integrated circuit, categorizes each tested integrated circuit, and separates each categorized circuit onto a separate die placement means such as a ring assembly, tray, die package, die tray, or more generally a frame. The die sort process also reads wafer identification information and wafer map information from the memories or the system network, and uses the information such as product type, wafer size, die size, product name, wafer count, wafer map, and the like to automatically or semi-automatically set up a "die sorter" with the proper parameters. Note that other devices that require sorting and placing, other than integrated circuits, may also be suitable for use in the present invention. Further, the adapter frames of the present invention can be used to store dice/waffle packs of the same properties or can be used to store different types of dice/waffle packs. The adapter frame may be unloaded and filled completely or the adapter frame may be partially filled, loaded back into the wafer cassette, and unloaded for additional filling.

Figure 5:
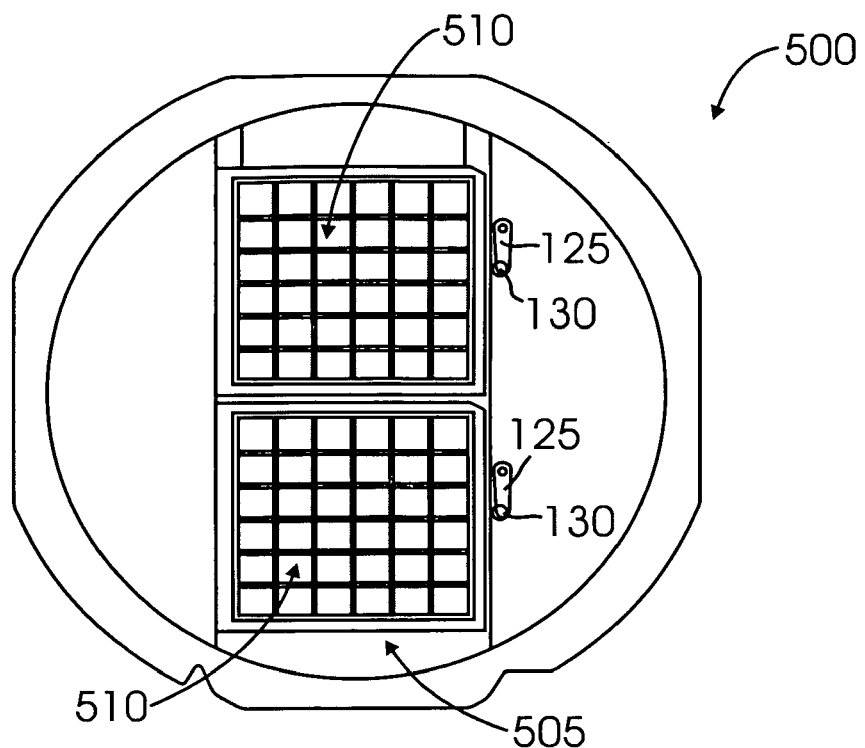
FIG. 5 shows an adapter frame having one large cavity according to another embodiment of the present invention.

FIG. 5 shows another embodiment of an adapter frame 500 for die sorting. Adapter frame 500 has one large recess or cavity 505. In this embodiment, adapter frame 500 corresponds to SEMI standard frame for an eight inch wafer and is capable of holding two 4"×4" waffle packs or GEL-PAK die carriers 510. Adapter frame 500 has two retention mechanisms or spring clips 125 along one side of cavity 505. As with the embodiment of FIGS. 1 and 2 above, spring clips 125 are located on adapter frame 500 such that ball bearing 130 is approximately at the center of 4"×4" die carriers 510 when loaded. Die carriers are slid towards barrier 115, which forces ball bearing 130 up and out of its slot, resulting in a spring force keeping die carriers 510 secured in cavity 505.

Figure 6:
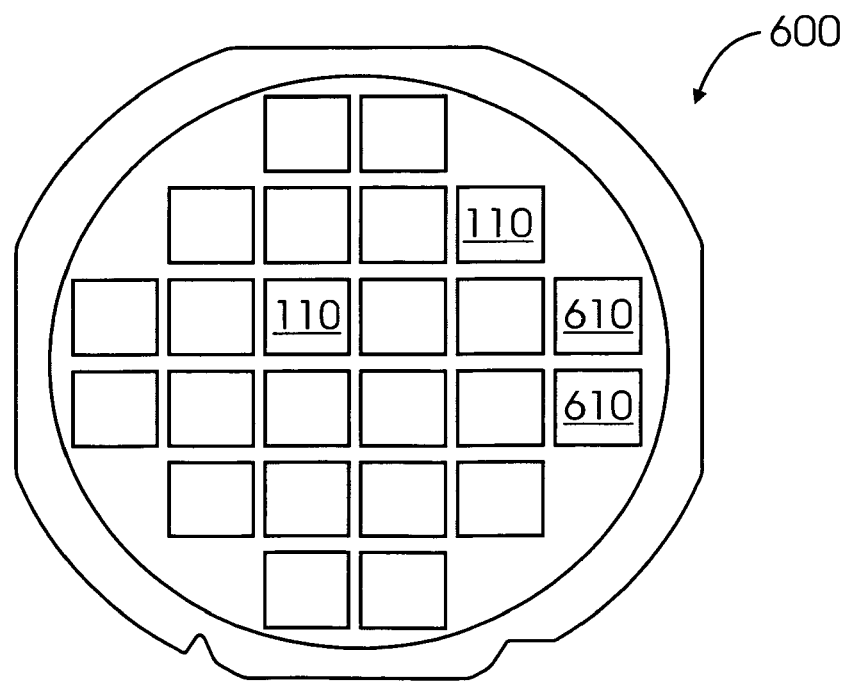
FIG. 6 shows an adapter frame having multiple individually molded die cavities according to one embodiment.

FIG. 6 shows an adapter frame 600 according to another embodiment of the present invention. Adapter frame 600 corresponds to SEMI standard frame for a twelve inch wafer and is capable of holding twenty-four 2"×2" waffle packs or GEL-PAK die carriers 110. Adapter frame 600 contains twenty four molded die cavities 610, as shown. Dice are placed into cavities 610 using the same procedure and equipment as placing die into standard die carrier cavities. As a result, there is no need for special handling or control software when using adapter frame 600 in a conventional die sorter. Any suitable number of cavities 610 may be used for different requirements and needs. In another embodiment, adapter frame 600 is handled like a single large waffle pack or wafer. Cavities 610 are molded to receive a single die each, instead of a die carrier that may have multiple cavities to hold multiple dice. As with the embodiment discussed above, the single die cavities can be arranged to hold twenty-four 2"×2" die or in different arrangements to hold different numbers of die.

Thus, as described above, the adapter frame of the present invention allows output die carriers, such as waffle packs or GEL-PAK carriers, to be presented to conventional die attach and die sort machines in the same or similar manner as that of normal tape mounted wafers. As a result, conventional die sorters can be used. Further, since the adapter frames are handled similarly to output wafers, waffle pack or Gel-Pak die carriers can be placed onto the adapter frames for processing without the need to install and/or replace specific handlers for these types of die carriers. This increases throughput and reduces costs of the semiconductor die manufacturing process.

The above-described embodiments of the present invention are merely meant to be illustrative and not limiting. It will thus be obvious to those skilled in the art that various changes and modifications may be made without departing from this invention in its broader aspects. For example, adapter frames with specific cavities are discussed above for holding various die carriers. However, other types of cavities or recesses may also be suitable such that the adapter frame is handled the same way as an output wafer, which allows dice to be sorted without the need for specific handlers. Therefore, the appended claims encompass all such changes and modifications as fall within the true spirit and scope of this invention.

What is claimed is:

1. An output adapter frame for a die sorter, comprising:
   at least one channel along the upper surface of the output adapter frame, wherein the channel holds a plurality of die carriers and has an open end and a closed end;
   a barrier located at the closed end of each channel; and
   a retention mechanism for each of the plurality of die carriers, wherein the retention mechanism is along a side of the channel and actively biases the die carrier against the opposing side of the channel.

2. The output adapter frame of claim 1, wherein the output frame has the same physical exterior dimensions as a SEMI standard film frame design for an 8-inch or 12-inch wafer.

3. The output adapter frame of claim 1, wherein the die carriers are waffle packs or GEL-PAK die carriers.

4. The output adapter frame of claim 1, wherein the die carriers are approximately 2" by 2".

5. The output adapter frame of claim 4, further comprising four channels in parallel with each other.

6. The output adapter frame of claim 5, wherein the four channels comprise two outer channels capable of holding two 2" by 2" die carriers each and two inner channels capable of holding four 2" by 2" die carriers each.

7. The output adapter frame of claim 1, wherein the die carriers are approximately 4" by 4".

8. The output adapter frame of claim 7, wherein the at least one channel is a single channel.

9. The output adapter frame of claim 8, wherein the single channel is capable of holding two 4" by 4" die carriers.

10. The output adapter frame of claim 1, wherein the output frame and the at least one channel are a unitary structure.

11. The output adapter frame of claim 1, wherein the retention mechanism is a spring clip.

12. An output adapter frame for use with a die sorter, comprising:
    a plurality of approximately square recesses, each square recess capable of holding one square die carrier, wherein the output adapter frame is handled in the same manner during the die sorting process as a SEMI standard output wafer frame, wherein the output frame has the same physical exterior dimensions as a SEMI standard film frame design for an 8-inch or 12-inch wafer.

13. An output adapter frame for use with a die sorter, comprising:
    a plurality of approximately square recesses, each square recess capable of holding one square die carrier, wherein the output adapter frame is handled in the same manner during the die sorting process as a SEMI standard output wafer frame, wherein the die carriers are approximately 2" by 2" or 4" by 4".

14. An output adapter frame for use with a die sorter, comprising:
    a plurality of approximately square recesses, each square recess capable of holding one square die carrier, wherein the output adapter frame is handled in the same manner during the die sorting process as a SEMI standard output wafer frame, wherein the adapter frame is a unitary structure.

15. A die sorter for sorting die contained in square die carriers, comprising:
    an input wafer cassette;
    a plurality of wafer frames containing the die, wherein the wafer frames are capable of being loaded and unloaded from the input wafer cassette;
    a first wafer frame handler for loading and unloading the wafer frames;
    an output wafer cassette;
    a plurality of adapter frames, wherein the adapter frames are capable of being loaded and unloaded from the output wafer cassette, and wherein the adapter frames comprise at least one recess capable of holding a plurality of die carriers having an open end and a closed end and at least one retention mechanism that actively biases the die carriers against an opposing side of the recess;
    a second wafer frame handler for loading and unloading the adapter frames; and
    a die sorting mechanism to sort the die onto the die carriers on the adapter frames.

16. The die sorter of claim 15, wherein the die carriers are waffle packs or GEL-PAK die carriers.

17. The die sorter of claim 15, wherein the adapter frames each comprise a plurality of parallel recesses, each recess capable of holding a plurality of the die carriers.

18. The die sorter of claim 17, wherein the adapter frames each further comprise a retention mechanism along one side of the recesses.

19. The die sorter of claim 15, wherein the adapter frames have the same physical exterior dimensions as a SEMI standard film frame design for 8-inch or 12-inch wafers.

* * * * *